May 4, 1965 R. W. JEBENS 3,182,210

BRIDGE MULTIVIBRATOR HAVING TRANSISTORS OF THE SAME CONDUCTIVITY TYPE

Filed April 26, 1963

INVENTOR

Robert W. Jebens

BY Hurvitz & Rose

ATTORNEY 3,182,210

BRIDGE MULTIVIBRATOR HAVING TRANSISTORS OF THE SAME CONDUCTIVITY TYPE

Robert W. Jebens, Arlington, Va., assignor to Melpar, Inc., Falls Church, Va., a corporation of Delaware Filed Apr. 26, 1963, Ser. No. 275,858
20 Claims. (Cl. 307—88.5)

Figure 2:
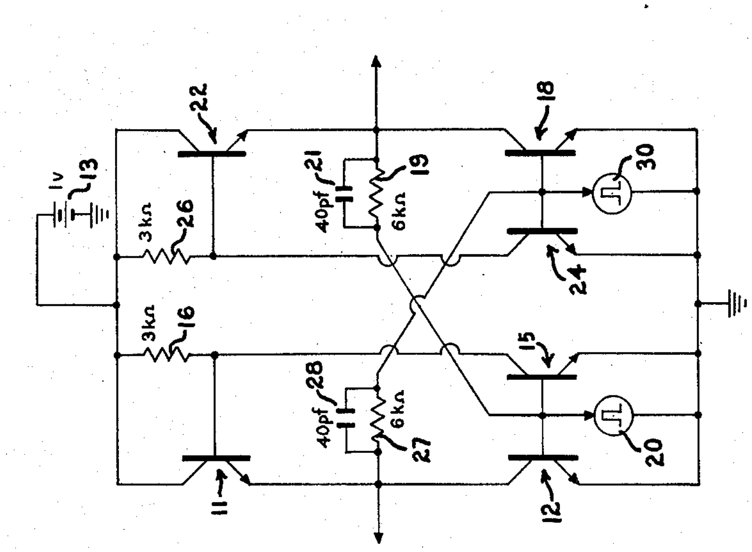

The present invention relates generally to transistor multivibrator circuits and more particularly to bridge type multivibrators wherein each transistor included therein is of a single conductivity type.

Bistable multivibrator or flip-flop circuits generally fall into two categories, the well known Eccles-Jordan type utilizing two similar transistors and the bridge type wherein two pairs of complementary conductivity type transistors are employed. The Eccles-Jordan flip-flop has very poor efficiency, usually less than 50%, and slow rise times in circuits supplied with sources of low power. Poor rise times result from the necessity of large valued resistors in the collector load circuit of the transistors. Such resistors increase the time constant of the charging circuits involving the interelectrode capacity of the transistors which prevents high speed coupling of pulses to the transistor control electrodes. Attempts to increase the rise time of the coupling circuits by reducing the value of the load resistors have not proven particularly feasible since they have caused the circuit efficiency to be reduced.

To cure the deficiencies of the Eccles-Jordan circuit, the bridge multivibrator utilizing two pairs of complementary conductivity type transistors was developed. The bridge circuit is characterized by fast switching speeds, hence good high frequency response, high efficiency, and low output impedances for both the leading and trailing edges of the derived waves.

The bridge circuit, however, is not adapted for utilization with microelectronic circuits of the single crystal type because it uses complementary type transistors and requires external connections to a pair of D.C. power supplies, rather than to one. The former defect results from the current inability to fabricate quality high speed PNP transistors on single crystal substrate boards. Even when this problem is eliminated, the additional diffusion steps necessary for manufacturing both NPN and PNP transistor types on a single crystal will be sufficiently difficult to make the conventional bridge circuit unattractive.

According to the present invention, four transistors of a single conductivity type are connected in a bridge multivibrator circuit. The bridge circuit of the invention has all the features of the prior art bridge circuit without the drawbacks thereof. The bridge transistors are connected in positive feedback circuits whereby one pair is conducting while the other pair is cut-off. To couple signals of the proper phase between the transistors, the collector of one transistor and the base of the other transistor of each transistor pair are coupled together by an amplifying and phase inverting transistor. Since the amplifying and phase inverting transistor is of the same conductivity type as the bridge transistors, a single crystal substrate may be utilized and the need for more than one power supply is obviated.

It is, accordingly, an object of the present invention to provide a new and improved multivibrator circuit.

Another object of the present invention is to provide a multivibrator particularly suited for high frequency microelectronic circuits having high efficiency, fast rise times, and low output impedances for both the leading and trailing edges of the generated voltages.

A further object of the present invention is to provide a bridge type transistor multivibrator having all the advantages associated with the bridge circuit, yet adapted for microelectronic circuits utilizing a single crystal substrate.

An additional object of the present invention is to provide a new and improved bridge type bistable multivibrator requiring only one power supply.

Yet another object of the present invention is to provide a bridge type multivibrator utilizing transistors of only one conductivity type.

Figure 1:
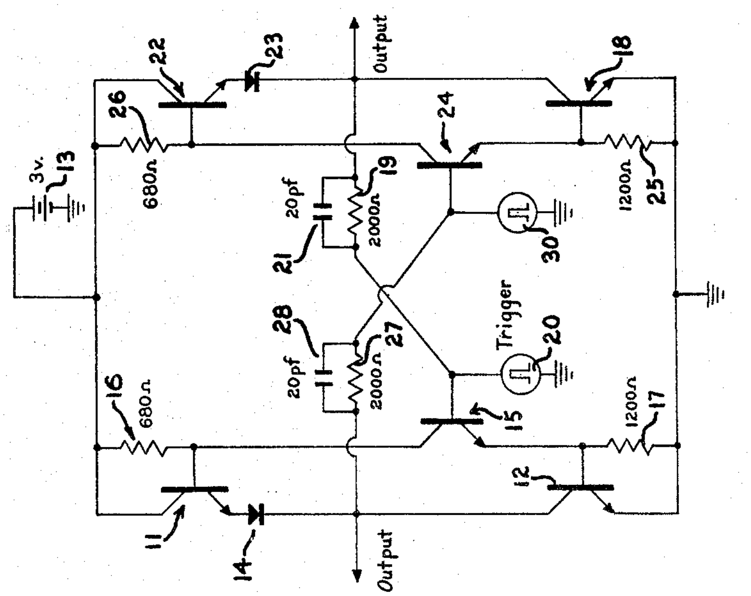

The above and still further objects, features and advantages of the present invention will become apparent upon consideration of the following detailed description of several specific embodiments thereof, especially when taken in conjunction with the accompanying drawings, wherein:

FIGURE 1 is a circuit diagram of one embodiment of a multivibrator of the present invention; and FIGURE 2 is a circuit diagram of another embodiment of a multivibrator of the present invention.

Reference is now made to FIGURE 1 of the drawing, a circuit diagram of a bistable multivibrator according to the invention, wherein NPN transistors 11 and 12 have their emitter collector paths connected in series between the positive terminal of D.C. supply 13 and ground. Biasing diode 14 has its anode and cathode connected between the emitter and collector of transistors 11 and 12, respectively. Control voltages for cutting transistors 11 and 12 on and off are developed across the bases thereof by resistors 16 and 17, responsive to the currents through the collector and emitter of switching transistor 15, respectively. Output impedances, across which the signals derived from the flip flop are developed, are connected between the collectors of transistors 12 and 18 and the positive or negative terminal of supply 13.

The base of transistor 15 is responsive to external trigger circuit 20 and the collector of NPN transistor 18. The latter electrode is D.C. coupled to the base of transistor 15 via the parallel combination of resistor 19 and pulse shaping capacitor 21.

Transistor 18 is connected to the positive terminal of supply 13 via transistor 22 and diode 23 in the identical manner that transistor 12 is connected through transistor 11 and diode 14. The connections of phase reversing switching transistor 24 to resistors 25 and 26 and the bases of NPN transistors 18 and 22 are identical with the similar connections of transistor 15 to transistors 11 and 12. Base control for transistor 24 is established by input trigger circuit 30 and the output voltage of transistor 12 coupled thereto via the circuit comprising the parallel combination of resistor 27 and capacitor 28

In operation, transistors 11, 24 and 18 are biased into one conduction state while transistors 12, 15, and 22 are biased into the opposite conduction state. Hence, a bridge circuit is formed having one pair of its oppositely located legs energized and the other pair of its oppositely located legs cut-off via the cross over circuits including transistors 15 and 24.

For purposes of explanation, it is assumed that transistor 24 is conducting in response to a positive trigger from source 30 at its base. In consequence, current flows from supply 13 through resistors 25 and 26 via the emitter collector path of transistor 24. The current through resistor 25 forward biases the base of transistor 18 so that its collector is essentially at ground potential. The voltage drop across resistor 26 reduces the base emitter voltage of transistor 22 to a level where the flow of collector current through this transistor is cut-off. An almost negligible amount of current flows from the base to the emitter of transistor 22 through biasing diode 23 that isolates the low voltage at the collector of transistor 18 from the emitter of transistor 22. If desired, biasing diodes 14 or 23 may be replaced with parallel resistance capacitance biasing circuits if higher output impedance and/or higher supply voltages can be tolerated.

Since the collector of transistor 18 is maintained at a low voltage, the voltage coupled to the base of transistor 15 is insufficient to bring the latter transistor into conduction. In consequence, there is no current flow through resistors 16 and 17 and the voltages at the positive and negative terminals of supply 13 are coupled to the bases of transistors 11 and 12, respectively. This forward biases transistor 11 into heavy conduction and cuts off current flow through transistor 12 so that the output voltage at its collector is maintained at a relatively large value.

In response to a negative trigger at the base of transistor 24 or a positive trigger at the base of transistor 15, the conduction states of all the transistors in the circuit are changed. Considering the positive trigger, transistor 15 is activated into its conducting state so that positively and negatively going voltages are developed at its emitter and collector, respectively. The negatively going voltage cuts off transistor 11 while the positively going voltage causes heavy conduction between the collector and emitter of transistor 12. Hence, the collector output voltage of transistor 12 is suddenly reduced. The negatively going voltage at the collector of transistor 12 is coupled through resistor 27 and capacitor 28 to the base of transistor 24 to drive that transistor into cut-off. With transistor 24 cut off, the bases of transistors 18 and 22 are driven negatively and positively into cut-off and conduction, respectively. In consequence, the collector voltage of transistor 18 is increased at the same time that the collector potential of transistor 12 is decreased. The increased voltage at the collector of transistor 18 is fed back to the base of transistor 15 to further drive that transistor into heavy conduction. It is thus seen that the operation is regeneratively cumulative and the rate at which the switching operation occurs is governed by the impedance offered by the resistors in the circuit. The latter fact results from the effect of the resistance capacitance charging circuit time constant for the transistor bases, the capacitance being the transistor interelectrode capacity.

Operation of the circuit in response to a negative pulse at the base of transistor 24 is the same as in response to a positive pulse of transistor 15 except the collector voltage of transistor 18 is assumed to increase prior to the increase at the base of transistor. It is also to be understood that the trigger source can be coupled in parallel to the bases of transistors 15 and 24 if the circuit is to function as a frequency divider, for example.

Reference is now made to FIGURE 2 of the drawings wherein the circuit of FIGURE 1 is modified so that fewer components, as well as less power are required, and lower voltage trigger and supply sources may be used. In the circuit of FIGURE 2, the bases and emitters of trigger transistors 15 and 24 are directly connected to the bases and emitters of bridge transistors 12 and 18, respectively. Hence, the base emitter junctions of transistors 12 and 15 are driven in parallel by the collector voltage of transistor 18 while the corresponding junctions of transistors 18 and 24 are driven by the collector of transistor 12. Because of these modifications, the need for emitter follower resistors 17 and 25 of FIGURE 1 is eliminated. Also, biasing diodes 14 and 23 are not required because the emitter base voltages of transistors 11 and 22 are not sufficient to drive the respective transistors into conduction when current is flowing through load resistors 16 and 26. The circuit of FIGURE 2 may employ a D.C. supply 13 of only one volt, compared to the three volt source of FIGURE 1. A further advantage of FIGURE 2 is that it requires only 0.1 milliwatt of power per megacycle of switching operation while the circuit of FIGURE 1 requires three times that amount.

Considering the operation of the bistable multivibrator of FIGURE 2, assume that a positive trigger has driven transistors 18 and 24 into conduction. In consequence, there is significant current flow through resistor 26 and the collectors of transistors 18 and 24 are essentially at ground potential. The base emitter voltage of transistor 22 is so small that collector conduction through the transistor is cut off.

The low voltage at the collector of transistor 18 is coupled to the bases of transistors 12 and 15 via the D.C. path through resistor 19, whereby the later transistors are driven into cut-off. In consequence, there is no current flow through resistor 16 so that the base emitter junction of transistor 11 is forward biased. Hence, the voltage at the positive terminal of source 13 is coupled through the emitter collector path of transistor 11 to the output terminal at the collector of transistor 12. At the same time transistor 12 is cut off to isolate its collector from ground.

It is now assumed that a positive pulse is coupled to the bases of transistors 12 and 15 so that these transistors are triggered into conduction. The trigger voltage is amplified and reversed in phase at the collectors of transistors 12 and 15. In consequence, the collector of transistor 12 is driven essentially to ground while transistor 11 is being cut off. The decreased voltage at the collector of transistor 12 is coupled via resistor 27 and capacitor 28 to the bases of transistors 18 and 24 to drive the latter transistors toward cut off. In consequence, the collector voltage of transistors 18 and 24 increases to cause conduction through transistor 22.

The increased voltage at the collector of transistor 18 is regeneratively coupled back to the bases of transistors 12 and 15 to reenforce the flow of current through them. The operation continues in this manner until transistors 12, 15 and 22 are conducting heavily and transistors 11, 18 and 24 are cut-off. The circuit remains in this state until the next positive trigger is coupled to the base of transistors 18 and 24, at which time the switching operation proceeds in the opposite manner.

The circuits of FIGURES 1 and 2 have been shown as being of the conventional component type. It is to be understood, however, that one of the advantages of the circuit, utilization of only one conductivity type transistor, is ideally suited to microelectronic networks. Hence, in a preferred embodiment, the transistors, resistors and capacitors are diffused on a silicon substrate according to the techniques generally known in the art.

While I have described and illustrated several specific embodiments of my invention, it will be clear that variations of the details of construction which are specifically illustrated and described may be resorted to without departing from the true spirit and scope of the invention as defined in the appended claims.

I claim:

1. A multivibrator comprising two pairs of transistors of the same conductivity type, positive feedback means connecting said pairs of transistors in a bridge circuit for rendering both transistors of one of said pairs in a first conducting state at the time both transistors of the other of said pairs are in another conducting state, an output signal being derived in response to the voltage between the collector and emitter of one transistor of each of said pairs, said positive feedback means including means for reversing the phase of an output signal derived from one of said pairs, and means for coupling the phase reversed signal to the base electrode of the other transistor in said one pair.

2. A multivibrator comprising two pairs of transistors of the same conductivity type, positive feedback means connecting said pairs of transistors in a bridge circuit for rendering both transistors of one of said pairs in a first conducting state at the time both transistors of the other of said pairs are in another conducting state, an output signal being derived in response to the voltage between the collector and emitter of one transistor of each of said pairs, said positive feedback means including means for amplifying and reversing the phase of an output signal derived from one of said pairs, and means for coupling the phase reversed signal to the base electrode of the other transistor in said one pair.

3. A multivibrator comprising two pairs of transistors of the same conductivity type, positive feedback means connecting said pairs of transistors in a bridge circuit for rendering both transistors of one of said pairs in a first conducting state at the time both transistors of the other of said pairs are in another conducting state, an output signal being derived indicative of the voltage across one transistor of each of said pairs, said positive feedback means including means for coupling the signal derived from one of said pairs to a control electrode of the other transistor of said one pair for simultaneously driving both said transistors in said one pair into the same conduction state, the emitter collector paths of the transistors in two first adjacent arms of said bridge being connected in a first series circuit, means for connecting the base electrodes of said transistors in said first adjacent arms only in circuits external to the current flowing in said first series circuit, the emitter collector paths of the transistors in two second adjacent arms of said bridge being connected in a second series circuit, and means for connecting the base electrodes of said transistors in said second adjacent arms only in circuits external to the current flowing in said second series circuit.

4. A multivibrator comprising first, second, third, and fourth transistors of the same conductivity type, said first and fourth transistors being grouped as a first pair, said second and third transistors being grouped as a second pair, means connecting the emitter collector paths of said first and third transistors in a first series circuit, means for connecting the base electrodes of said first and third transistors only in circuits external to the current flowing in said first series circuit, means connecting the emitter collector paths of said second and fourth transistors in a second series circuit means for connecting the base electrodes of said second and fourth transistors only in circuits external to the current flowing in said second series circuit parallel to said first series circuit, and positive feedback means connecting all of said transistors together for rendering both transistors of said first pair into a first conductivity state while both transistors of said second pair are rendered into a second conductivity state.

5. A multivibrator comprising first, second, third, and fourth transistors of the same conductivity type, said first and fourth transistors being grouped as a first pair, said second and third transistors being grouped as a second pair, means connecting the emitter collector paths of said first and third transistors in a first series circuit, means connecting the emitter collector paths of said second and fourth transistors in a second series circuit parallel to said first series circuit, and positive feedback means connecting all of said transistors together for rendering both transistors of said first pair into a first conductivity state while both transistors of said second pair are rendered into a second conductivity state wherein said positive feedback means includes a further transistor of said conductivity type, said transistor having its base responsive to the voltage across said fourth transistor, said further transistor deriving at its collector a signal reversed in phase from said voltage, and means for coupling said signal to the base of said first transistor.

6. A multivibrator comprising first, second, third, and fourth transistors of the same conductivity type, said first and fourth transistors being grouped as a first pair, said second and third transistors being grouped as a second pair, means connecting the emitter collector paths of said first and third transistors in a first series circuit, means connecting the emitter collector paths of said second and fourth transistors in a second series circuit parallel to said first series circuit, and positive feedback means connecting all of said transistors together for rendering both transistors of said first pair into a first conductivity state while both transistors of said second pair are rendered into a second conductivity state wherein said positive feedback means includes; means for coupling signals indicative of the voltage across said fourth transistor to the bases of said first and third transistors, said last named means including means coupling signals to the bases of said first and third transistors in opposite phase relationships.

7. The multivibrator of claim 6 wherein said means for coupling includes a further transistor of said conductivity type, the base of said further transistor being responsive to the voltage across said fourth transistor, the collector of said further transistor being coupled to the base of said first transistor.

8. The multivibrator of claim 7 including means for connecting the bases of said third and further transistors together, and means for connecting the emitters of said third and further transistors together.

9. The multivibrator of claim 7 including means for coupling the emitter signal of the further transistor to the base of the third transistor.

10. The multivibrator of claim 9 including impedance means for biasing the emitter base junction of said first and second transistors.

11. A bistable multivibrator comprising first, second, third, and fourth transistors of the same conductivity type, said first and fourth transistors being grouped as a first pair, said second and third transistors being grouped as a second pair, means connecting the emitter collector paths of said first and third transistors in a first series circuit, means for connecting the base electrodes of said first and third transistors only in circuits external to the current flowing in said first series circuit means connecting the emitter collector paths of said second and fourth transistors in a second series circuit means for connecting the base electrodes of said second and fourth transistors only in circuits external to the current flowing in said second series circuit parallel to said first series circuit, and direct coupled positive feedback means connecting all of said transistors together for rendering both transistors of said first pair into a first conductivity state while both transistors of said second pair are rendered into a second conductivity state.

12. A bistable multivibrator comprising first, second, third, and fourth transistors of the same conductivity type, said first and fourth transistors being grouped as a first pair, said second and third transistors being grouped as a second pair, means connecting the emitter collector paths of said first and third transistors in a first series circuit, means connecting the emitter collector paths of said second and fourth transistors in a second series circuit parallel to said first series circuit, and direct coupled positive feedback means connecting all of said transistors together for rendering both transistors of said first pair into a first conductivity state while both transistors of said second pair are rendered into a second conductivity state wherein said positive feedback means includes; first means for coupling signals indicative of the voltage across said fourth transistor to the bases of said first and third transistors, said last named means including means coupling signals to the bases of said first and third transistors in opposite phase relationships, second means for coupling signals indicative of the voltage across said third transistor to the bases of said second and fourth transistors, said last named means including means coupling signals to the bases of said second and fourth transistors in opposite phase relationships.

13. The multivibrator of claim 12 wherein said first and second means for coupling includes fifth and sixth transistors of said conductivity type, the base of said fifth transistor being responsive to the voltage across said fourth transistor, the collector of said fifth transistor being coupled to the base of said first transistor, the base of said sixth transistor being responsive to the voltage across said third transistor, the collector of said sixth transistor being coupled to the base of said second transistor.

14. The multivibrator of claim 13 including means for connecting the bases of said third and fifth transistors together, means for connecting the emitters of said third and fifth transistors together, means for connecting the bases of said fourth and sixth transistors together and means for connecting the emitters of said fourth and sixth transistors together.

15. The multivibrator of claim 13 including means for coupling the emitter signal of the fifth transistor to the base of the third transistor, and means for coupling the emitter signal of the sixth transistor to the base of the fourth transistor.

16. A bistable multivibrator comprising two pairs of transistors of the same conductivity type, direct coupled positive feedback means connecting said pairs of transistors in a bridge circuit for rendering both transistors of one of said pairs in a first conducting state at the time both transistors of the other of said pairs are in another conducting state, an output signal being derived indicative of the voltage across one transistor of each of said pairs, said positive feedback means including means for coupling the signal derived from one of said pairs to a control electrode of the other transistor of said one pair for simultaneously driving both said transistros in said one pair into the same conduction state, the emitter collector paths of the transistors in two first adjacent arms of said bridge being connected in a first series circuit, means for connecting the base electrodes of said transistors in said first adjacent arms only in circuits external to the current flowing in said first series circuit, the emitter collector paths of the transistors in two second adjacent arms of said bridge being connected in a second series circuit, and means for connecting the base electrodes of said transistors in said second adjacent arms only in circuits external to the current flowing in said second series circuit.

17. The multivibrator of claim 11 wherein said positive feedback means includes; first means for coupling signals indicative of the voltage across said fourth transistor to the bases of said first and third transistors, said last named means including means coupling signals to the bases of said first and third transistors in opposite phase relationships, second means for coupling signals indicative of the voltage across said third transistor to the bases of said second and fourth transistors, said last named means including means coupling signals to the bases of said second and fourth transistors in opposite phase relationships.

18. The multivibrator of claim 17 wherein said first and second means for coupling includes fifth and sixth transistors of said conductivity type, the base of said fifth transistor being responsive to the voltage across said fourth transistor, the collector of said fifth transistor being coupled to the base of said first transistor, the base of said sixth transistor being responsive to the voltage across said third transistor, the collector of said sixth transistor being coupled to the base of said second transistor.

19. The multivibrator of claim 18 including means for connecting the bases of said third and fifth transistors together, means for connecting the emitters of said third and fifth transistors together, means for connecting the bases of said fourth and sixth transistors together, and means for connecting the emitters of said fourth and sixth transistors together.

20. The multivibrator of claim 18 including means for coupling the emitter signal of the fifth transistor to the base of the third transistor, and means for coupling the emitter signal of the sixth transistor to the base of the fourth transistor.

References Cited by the Examiner

UNITED STATES PATENTS

| | | | |
|---|---|---|---|
| 2,874,315 | 2/59 | Reichert | 307—88.5 X |
| 2,888,579 | 5/59 | Wanlass | 307—88.5 |
| 2,946,897 | 7/60 | Mayo | 307—88.5 |
| 2,946,898 | 7/60 | Jensen | 307—88.5 |
| 3,045,128 | 7/62 | Skerritt | 328—206 X |

JOHN W. HUCKERT, *Primary Examiner.*